(12) United States Patent
Feng (10) Patent No.: US 12,245,477 B2
(45) Date of Patent: Mar. 4, 2025

(54) DISPLAY PANEL INCLUDING LIGHT EMITTING DIODES WITH IMPROVED ELECTRICAL CONNECTION OF CATHODES, METHOD OF MANUFACTURING THE SAME, AND DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventor: Huajun Feng, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/762,035

(22) PCT Filed: Feb. 25, 2022

(86) PCT No.: PCT/CN2022/077966
§ 371 (c)(1),
(2) Date: Mar. 18, 2022

(87) PCT Pub. No.: WO2023/155232
PCT Pub. Date: Aug. 24, 2023

(65) Prior Publication Data
US 2024/0147784 A1    May 2, 2024

(30) Foreign Application Priority Data
Feb. 17, 2022    (CN) .......................... 202210146994.2

(51) Int. Cl.
*H10K 59/131*    (2023.01)
*H10K 59/12*    (2023.01)
*H10K 59/80*    (2023.01)
*H10K 102/00*    (2023.01)

(52) U.S. Cl.
CPC ....... *H10K 59/131* (2023.02); *H10K 59/1201* (2023.02); *H10K 59/873* (2023.02); *H10K 2102/3026* (2023.02)

(58) Field of Classification Search
CPC ................................................... H10K 59/131
(Continued)

(56) References Cited

U.S. PATENT DOCUMENTS

2006/0273712 A1    12/2006   Yaegashi
2007/0108899 A1    5/2007    Jung et al.
(Continued)

FOREIGN PATENT DOCUMENTS

CN    101728419 A    6/2010
CN    104733640 A    6/2015
(Continued)

OTHER PUBLICATIONS

PCT International Search Report for International Application No. PCT/CN2022/077966, mailed Nov. 18, 2022.
(Continued)

*Primary Examiner* — Ajay Arora
(74) *Attorney, Agent, or Firm* — The Roy Gross Law Firm, LLC; Roy Gross (57) ABSTRACT

Embodiments of the present application provide a display panel, a method of manufacturing the same, and a display device. The display panel includes: a driving layer, including a plurality of driving units; anodes; a light-emitting portion; cathodes; an encapsulation layer provided with a plurality of via holes to expose the cathodes corresponding to each of the driving units; a plurality of conductive portions correspond- (Continued)

ingly disposed in the plurality of via holes; and a conductive layer is connected to each of the cathodes through a corresponding one of the conductive portions in the via holes, so that each of the cathodes is connected to the conductive layer in parallel, and an equivalent resistance at opposite ends of the cathode is reduced, thereby reducing the voltage drop existing at opposite ends of the cathode.

18 Claims, 6 Drawing Sheets

(58) Field of Classification Search
USPC .......................................................... 257/40
See application file for complete search history.

(56) References Cited

U.S. PATENT DOCUMENTS

2010/0097295 A1* 4/2010 Kwak .................. H10K 50/828
345/32

2011/0140119 A1* 6/2011 Oh ....................... H10K 50/846
257/E33.001
2015/0171155 A1* 6/2015 Yun ....................... H10K 59/124
257/40

FOREIGN PATENT DOCUMENTS

| CN | 109742260 A | * | 5/2019 |
| CN | 110061151 A | | 7/2019 |
| CN | 112786805 A | | 5/2021 |
| JP | 2007095518 A | | 4/2007 |

OTHER PUBLICATIONS

PCT Written Opinion for International Application No. PCT/CN2022/077966, mailed on Nov. 18, 2022.
Chinese Office Action issued in corresponding Chinese Patent Application No. 202210146994.2 dated May 12, 2023, pp. 1-8, 20pp.

* cited by examiner

FIG. 4 providing a substrate; ~301 forming a plurality of driving units on the substrate at intervals to form a driving layer; ~302 forming anodes on the driving units; ~303 forming a light-emitting portion on the anodes; ~304 forming cathodes on the light-emitting portion; ~305 forming an encapsulation layer on the cathodes, wherein the encapsulation layer is provided with a plurality of via holes to expose the cathodes corresponding to each of the driving units; ~306 forming a plurality of conductive portions correspondingly in the plurality of via holes; and ~307 forming the conductive layer on the encapsulation layer to connected to each of the cathodes through a corresponding one of the conductive portions in the via holes so that each of the cathodes is connected to the conductive layer in parallel. ~308

DISPLAY PANEL INCLUDING LIGHT EMITTING DIODES WITH IMPROVED ELECTRICAL CONNECTION OF CATHODES, METHOD OF MANUFACTURING THE SAME, AND DISPLAY DEVICE

CROSS REFERENCE TO RELATED APPLICATIONS

This application is a National Phase of PCT Patent Application No. PCT/CN2022/077966 having International filing date of Feb. 25, 2022, which claims the benefit of priority Chinese Application No. 202210146994.2, filed on Feb. 17, 2022. The contents of the above applications are all incorporated by reference as if fully set forth herein in their entirety.

BACKGROUND OF INVENTION

Field of Invention

The present application belongs to the field of display technology, and in particular, relates to a display panel, a method of manufacturing the same, and a display device.

Description of Prior Art

An organic light-emitting diode (OLED) display device is a research hotspot in recent years, which has the advantages of self-luminescence, all-solid-state, high contrast, and can realize flexible screen design.

In order to increase resolution of OLED display devices, more and more top emission display devices have been developed. However, a thickness of a cathode in the existing top emission display device is generally thin, which makes the cathode have a large impedance and generates a relatively high voltage drop (IR drop), which is likely to cause uneven light emission of the display device.

The thickness of the cathode in the existing top-emission display device is generally thin, which makes the cathode have a large impedance and generates a relatively high voltage drop, which is likely to cause uneven light emission of the display device.

SUMMARY OF INVENTION

Embodiments of the present application provide a display panel, a method of manufacturing the same, and a display device, so as to solve the problem that the thickness of the cathode in the existing top emission display device is generally thin, making the cathode have a large impedance and generates a relatively high voltage drop, which is easy to cause a problem of uneven light emission of the display device.

In a first aspect, an embodiment of the present application provides a display panel, including:
 a driving layer including a plurality of driving units arranged at intervals;
 anodes disposed on a side of the driving units;
 a light-emitting portion disposed on a side of the anodes away from the driving units;
 cathodes disposed on a side of the light-emitting portion away from the driving units;
 an encapsulation layer disposed on a side of the cathodes away from the driving units, wherein the encapsulation layer is provided with a plurality of via holes to expose the cathodes corresponding to each of the driving units;
 a plurality of conductive portions correspondingly disposed in the plurality of via holes; and
 a conductive layer disposed on a side of the encapsulation layer away from the driving units, wherein the conductive layer is connected to each of the cathodes through a corresponding one of the conductive portions in the via holes, so that each of the cathodes is connected to the conductive layer in parallel.

In a second aspect, an embodiment of the present application further provides a method of manufacturing a display panel, including:
 providing a substrate;
 forming a plurality of driving units on the substrate at intervals to form a driving layer;
 forming anodes on the driving units;
 forming a light-emitting portion on the anodes;
 forming cathodes on the light-emitting portion;
 forming an encapsulation layer on the cathodes, wherein the encapsulation layer is provided with a plurality of via holes to expose the cathodes corresponding to each of the driving units;
 forming a plurality of conductive portions correspondingly in the plurality of via holes; and
 forming the conductive layer on the encapsulation layer to connected to each of the cathodes through a corresponding one of the conductive portions in the via holes so that each of the cathodes is connected to the conductive layer in parallel.

In a third aspect, an embodiment of the present application further provides a display device, including:
 Display panel, including:
 a display panel, including:
 a driving layer including a plurality of driving units arranged at intervals;
 anodes disposed on a side of the driving units;
 a light-emitting portion disposed on a side of the anodes away from the driving units;
 cathodes disposed on a side of the light-emitting portion away from the driving units;
 an encapsulation layer disposed on a side of the cathodes away from the driving units, wherein the encapsulation layer is provided with a plurality of via holes to expose the cathodes corresponding to each of the driving units;
 a plurality of conductive portions corresponding to the plurality of via holes;
 a conductive layer is disposed on a side of the encapsulation layer away from the driving units, wherein the conductive layer is connected to each of the cathodes through a corresponding one of the conductive portions in the via holes, so that each of the cathodes is connected to the conductive layer in parallel; and
 a casing configured to carry the display panel.

In the display panel, the method of manufacturing the same, and the display device according to the embodiments of the present application, by arranging a conductive layer on a side of the encapsulation layer away from the cathode, connecting the conductive layer in parallel with the cathode corresponding to each driving unit, the equivalent resistance at opposite ends of the cathode can be reduced. Compared with the existing solution of only setting a thinner cathode, the impedance that can be transmitted by the cathode and the conductive layer of the present application is smaller, thereby reducing the voltage drop existing at opposite ends of the cathode and improving the display uniformity of the display device.

BRIEF DESCRIPTION OF DRAWINGS

In order to more clearly illustrate the technical solutions of the embodiments of the application, the drawings illustrating the embodiments will be briefly described below. Obviously, the drawings in the following description merely illustrate some embodiments of the present invention. Other drawings may also be obtained by those skilled in the art according to these figures without paying creative work.

In order to have a more complete understanding of the present application and its beneficial effects, the description will be given below in conjunction with the accompanying drawings. The same reference numerals in the following description indicate the same elements.

DETAILED DESCRIPTION OF PREFERRED EMBODIMENTS

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application.

In order to solve the problem that a thickness of a cathode in the existing top emission display device is generally thin, which makes the cathode have a large impedance, results in a relatively high voltage drop, and easily causes uneven light emission of the display device, the embodiments of the present application provide a display panel, a method of manufacturing the same, and a display device, which will be described below with reference to the accompanying drawings.

Figure 1:
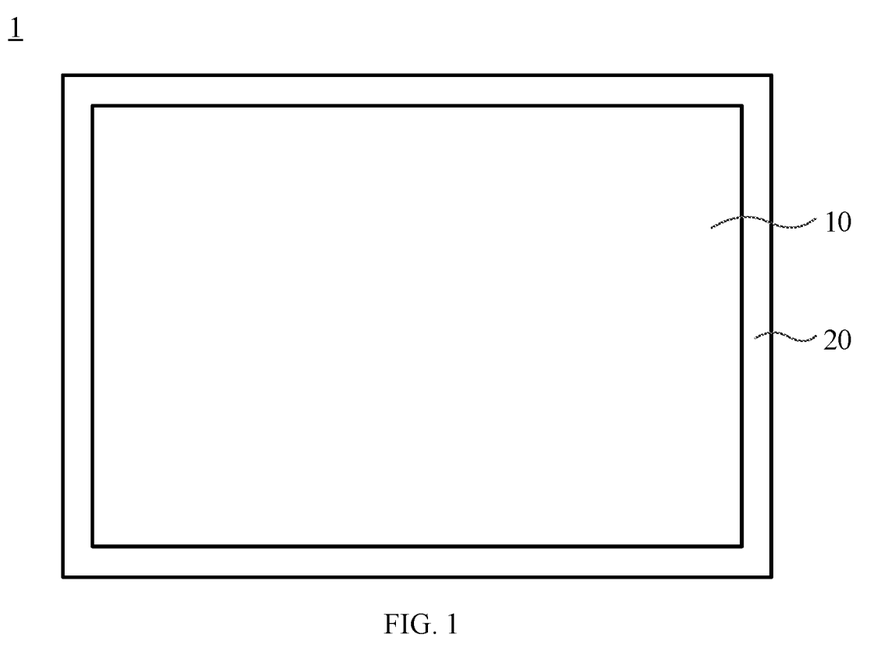
FIG. 1 is a schematic structural diagram of a display device provided by an embodiment of the present application.

Exemplarily, referring to FIG. 1, FIG. 1 is a schematic structural diagram of a display device provided by an embodiment of the present application. The embodiment of the present application provides a display device 1, the display device 1 may include a display panel 10 and a casing 20, the display panel 10 is mounted on the casing 20, the casing 20 may be configured to carry the display panel 10, and a main control circuit board and the like may be disposed in the casing 20 to control the display panel 10.

Exemplarily, the display device 1 may be a mobile electronic device such as a mobile phone and a tablet, and the display device 1 may also be a device with a display function, such as a computer device, a television, or an in-vehicle computer.

The display panel 10 may be a device including an Organic Light-Emitting Diode (OLED), or the light-emitting form of components in the display panel 1 is an OLED light-emitting form. An OLED belongs to a current-type organic light-emitting device, which has a phenomenon of luminescence caused by an injection and recombination of carriers, and the luminous intensity is proportional to the injected current. Under an action of an electric field, holes generated by an anode and electrons generated by a cathode will move, be injected into a hole transport layer and an electron transport layer, respectively, and migrate to a light-emitting layer. When the holes and electrons meet in the light-emitting layer, energy excitons are generated, thereby exciting the light-emitting molecules and finally generating visible light.

In order to increase the resolution of OLED devices, top emission display panels have been developed. Due to a need to increase transmittance of light, the thickness of the cathode is generally thin, which leads to a large cathode impedance and a relatively high voltage drop, which is likely to cause uneven light emission of the display device.

Figure 2:
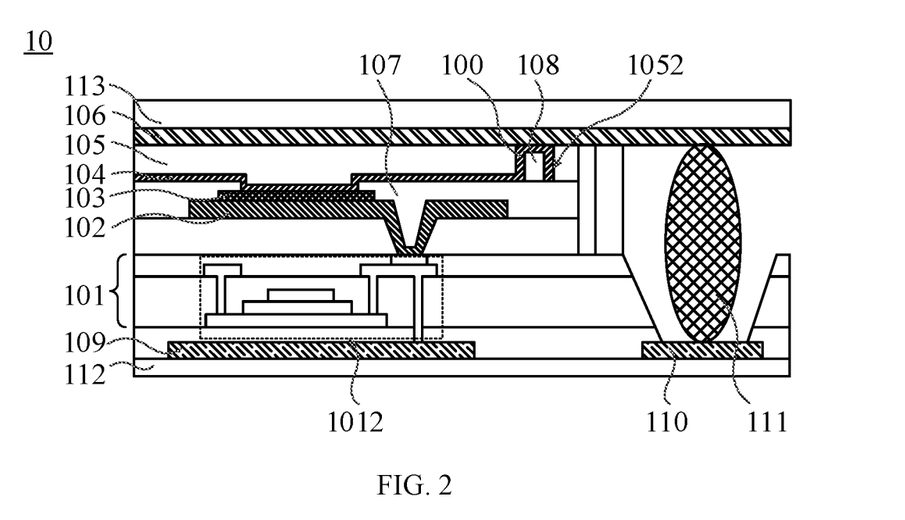
FIG. 2 is a schematic diagram of a first structure of a display panel in the display device shown in FIG. 1.
Figure 3:
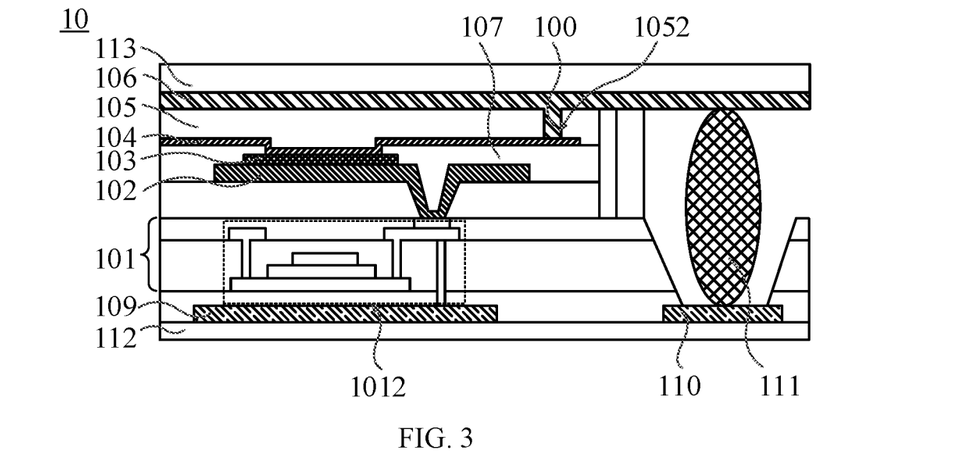
FIG. 3 is a schematic diagram of a second structure of the display panel in the display device shown in FIG. 1.

In order to solve the above problems, embodiments of the present application improve a structure of the display panel 10. Exemplarily, referring to FIG. 2 and FIG. 3 in conjunction with FIG. 1, FIG. 2 is a schematic diagram of the first structure of the display panel in the display device shown in FIG. 1, and FIG. 3 is a schematic diagram of the second structure of the display panel in the display device shown in FIG. 1. The display panel 10 may include a driving layer 101, an anode 102, a light-emitting portion 103, a cathode 104, an encapsulation layer 105, a conductive layer 106, and a plurality of conductive portions 100. The driving layer 101 may include a plurality of driving units 1012 arranged at intervals. The anode 102 is disposed on one side of the driving unit 1012. The light-emitting portion 103 is disposed on the side of the anode 102 away from the driving unit 1012. The cathode 104 is disposed on the side of the light-emitting portion 103 away from the driving unit 1012. The encapsulation layer 105 is disposed on the side of the cathode 104 away from the driving unit 1012, and a plurality of via holes 1052 are disposed in the encapsulation layer 105 to expose the cathode 104 corresponding to each driving unit 1012. The plurality of conductive portions 100 are correspondingly disposed in the plurality of via holes 1052. The conductive layer 106 is disposed on the side of the encapsulation layer 105 away from the driving unit 1012, and the conductive layer 106 and each cathode 104 are connected through the conductive portion 100 in the corresponding via hole 1052, so that each cathode 104 and the conductive layer 106 are connected in parallel. By disposing the conductive layer 106 on the side of the encapsulation layer 105 away from the cathode 104, and connecting the conductive layer 106 in parallel with the cathode 104 corresponding to each driving unit 1012, an equivalent resistance at opposite ends of the cathode 104 can be reduced. Compared to the solution of only setting a thinner cathode, the cathode 104 and the conductive layer 106 of the present application can transmit less impedance, thereby reducing the voltage drop at opposite ends of the cathode 104 and improving a display uniformity of the display device 1.

It is appreciated that the driving unit 1012, the anode 102, the light-emitting portion 103, the cathode 104, the encapsulation layer 105, and the conductive layer 106 are stacked in sequence. The anode 102, the light-emitting portion 103, and the cathode 104 can be regarded as a light-emitting unit, and the encapsulation layer 105 and the conductive layer 106 can be regarded as an encapsulation unit. That is, the display panel 10 may include a driving layer 101, a light-emitting layer, and an encapsulation layer 105, and the driving layer 101 includes a plurality of driving units 1012 arranged at intervals, and each driving unit 1012 is also a thin film transistor (TFT) structure, each driving unit 1012 may include a gate electrode, a source electrode, a drain electrode, an interlayer insulating layer, an interlayer dielectric layer, and the like, which are stacked. The light-emitting layer includes light-emitting units arranged in a one-to-one correspondence with the driving units 1012, and each light-emitting unit may further include an anode 102, a light-emitting portion 103, and a cathode 104. The light-emitting layer is sandwiched between the driving layer 101 and the encapsulation layer 105, and the encapsulation layer 105 is configured to encapsulate the light-emitting layer to block an influence of external water vapor on the light-emitting layer.

The light-emitting portion 103 may also be referred to as a pixel unit, and the light-emitting portion 103 is sandwiched between the anode 102 and the cathode 104. The light-emitting portion 103 can be made of organic semiconductor material. The light emission of the light-emitting portion 103 is caused by injection and recombination of carriers of the anode 102 and the cathode 104, and a luminous intensity is proportional to the injected current. The light-emitting portion 103 may also include a structure of multiple layers, such as a hole injection layer, a hole transport layer, and the like.

In order to reduce a transmission impedance of the cathode 104 and further reduce the voltage drop of the cathode 104, the conductive layer 106 is added in the embodiment of the present application. The transmission impedance of the conductive layer 106 and the cathode 104 is small, thereby reducing the voltage drop of the cathode 104 to improve the display uniformity of the display device 1.

Exemplarily, the conductive layer 106 may be made of a transparent conductive material, and a transparent oxide material may be used. Exemplarily, the conductive layer 106 can be made of indium tin oxide (ITO) material. ITO is a mixture, a transparent brown film or a yellowish gray mass, made of 90% In2O3 and 10% SnO2. For another example, the conductive layer 106 may also be made of indium zinc oxide (IZO) material. Of course, a material of the conductive layer 106 may also be other materials, which will not be exemplified herein.

The light transmittance of the conductive layer 106 is greater than the light transmittance of the cathode 104, so that the additione of the conductive layer 106 will not impact the light transmittance of the display panel 10. Compared with the existing solution of only setting a thinner cathode, the parallel connection of the cathode 104 and the conductive layer 106 of the present application can reduce the equivalent resistance at opposite ends of the cathode 104, thereby reducing the voltage drop at opposite ends of the cathode 104 and improving the display uniformity of the display device 1.

It should be noted that, the parallel connection between the conductive layer 106 and each cathode 104 can be performed in the following two methods.

In the first case, that is, corresponding to the case in FIG. 2, a manner of raising the cathode 104 to connect with the conductive layer 106 may be provided. In this case, the conductive portion 100 may be integrally formed with the cathode 104. Exemplarily, the display panel 10 may further include a blocking layer 107 disposed between the anode 102 and the cathode 104 and adjacent to the light-emitting portion 103. The blocking layer 107 can also be referred to as a black matrix or a light-shielding layer. The blocking layer 107 is configured to separate the anode 102 from the cathode 104 and can separate the light-emitting portions 103 between different light-emitting units to prevent the interference between the light-emitting portions 103.

The display panel 10 may further include a plurality of protrusions 108, each protrusion 108 is disposed between the cathode 104 and the blocking layer 107, and the plurality of protrusions 108 are respectively disposed in the plurality of via holes 1052. It should be noted that a part of the cathode 104 is arranged in the via hole 1052, and the arrangement of the protrusion 108 can raise the portion of the cathode 104 corresponding to the via hole 1052 to facilitate the connection between the cathode 104 and the conductive layer 106. Exemplarily, an upper surface of the cathode 104 connected to the conductive layer 106 is flush with an upper surface of the encapsulation layer 105 facing the conductive layer 106. The cathode 104 arranged in this way can be easily connected to the conductive layer 106. During fabrication, the cathode 104 and the conductive layer 106 can be separately fabricated at the same time, and then the fabricated conductive layer 106 is buckled to the encapsulation layer 105, so that the conductive layer 106 and the cathode 104 are connected in parallel.

In the second case, that is, corresponding to the case in FIG. 3, a part of the conductive layer 106 can be disposed in the via hole 1052 and connected to the cathode 104, and the conductive portion 100 can be integrally formed with the conductive layer 106. That is to say, the thickness of the portion of the conductive layer 106 corresponding to the via hole 1052 is greater than the thickness of the conductive layer 106 corresponding to a region other than the via holes 1052 of the encapsulation layer 105. In this case, the protrusion 108 may not be provided, that is, a part of the conductive layer 106 is completely filled in the via hole 1052. Of course, the protrusion 108 can also be optionally provided. In this case, the height of the protrusion 108 can be smaller than the height of the protrusion 108 in the first case, that is, a sum of the thickness of the conductive layer 106 in the via hole 1052 and the thickness of the cathode 104 and the thickness of the protrusion 108 inside the via hole 1052 is equal to the height of the via hole 1052.

Of course, the parallel connection between the conductive layer 106 and the cathode 104 may also have other cases, which will not be repeated herein.

Figure 4:
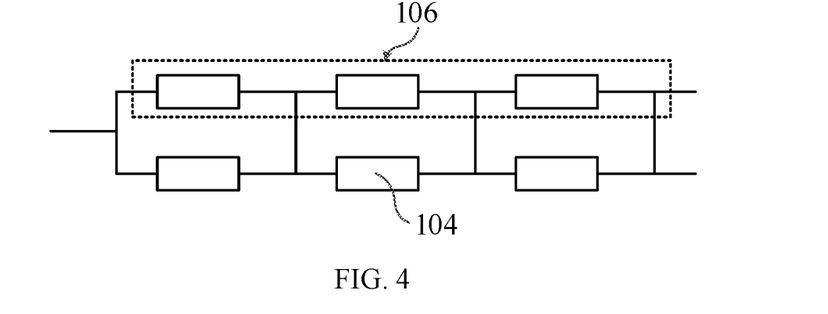
FIG. 4 is a schematic structural diagram of an equivalent circuit of a cathode and a conductive layer provided in an embodiment of the present application.

Exemplarily, referring to FIG. 4 in conjunction with FIG. 1 to FIG. 3, FIG. 4 is a schematic structural diagram of an equivalent circuit of a cathode and a conductive layer provided by an embodiment of the present application. The parallel connection of the conductive layer 106 and the cathode 104 can reduce the equivalent resistance at opposite ends of the cathode 104, thereby reducing the voltage drop of the cathode 104 and improving the display uniformity of the display device 1.

It should be noted that an orthographic projection of the conductive portion 100 in each via hole 1052 on the conductive layer 106 is spaced from an orthographic projection of the corresponding light-emitting portion 103 on the conductive layer 106 to prevent the thickness of the connection between the cathode 104 and the conductive layer 106 from impacting the light-emitting portion 103, for example, impacting the light transmittance of the light-emitting portion 103.

It should be noted that conductive metal may also be provided to increase the conductivity of the cathode 104 and the conductive layer 106. Exemplarily, still referring to FIG. 2 and FIG. 3, the display panel 10 may further include a first metal portion 109, a second metal portion 110, and a conductive gold ball 111. The first metal portion 109 may be disposed on the side of the driving unit 1012 away from the light-emitting portion 103, and the first metal portion 109 may be connected to the driving unit 1012 to transmit scan signals or electrical signals to the driving unit 1012. The second metal portion 110 and the first metal portion 109 are disposed in the same layer and spaced apart from each other, that is, the second metal portion 110 does not correspond to the driving unit 1012, and the second metal portion 110 and the driving unit 1012 are staggered with each other. The conductive gold ball 111 connects the second metal portion 110 to the conductive layer 106. For example, in a power-on state, the current can flow to the conductive layer 106 through the peripheral conductive gold balls 111, and then be transmitted to the cathode 104, thereby increasing the conductivity of the conductive layer 106 and the cathode 104.

Each of the first metal portion 109 and the second metal portion 110 is a first metal layer fabricated in the manufacturing of the display panel 10, and then the driving unit 1012 and the light-emitting unit are fabricated sequentially on the first metal portion 109.

The conductive gold ball 111 spans the driving unit and the light-emitting unit, and connects the second metal portion 110 to the conductive layer 106, so that the current can be introduced from the second metal portion 110 and flow to the cathode 104 through the conductive gold ball 111 and the conductive layer 106 in sequence. Exemplarily, the conductive gold ball 111 may only be disposed at an edge of the display panel 10. The light-emitting layer and the conductive gold ball 111 may be spaced apart by a gettering agent and a blocking portion, so as to prevent mutual interference between the metal in the light-emitting layer and the conductive gold ball 111.

In order to more clearly describe the structure and composition of the display panel 10 according to the embodiment of the present application, the following description will be made from the perspective of a method of manufacturing the display panel.

Figure 5:
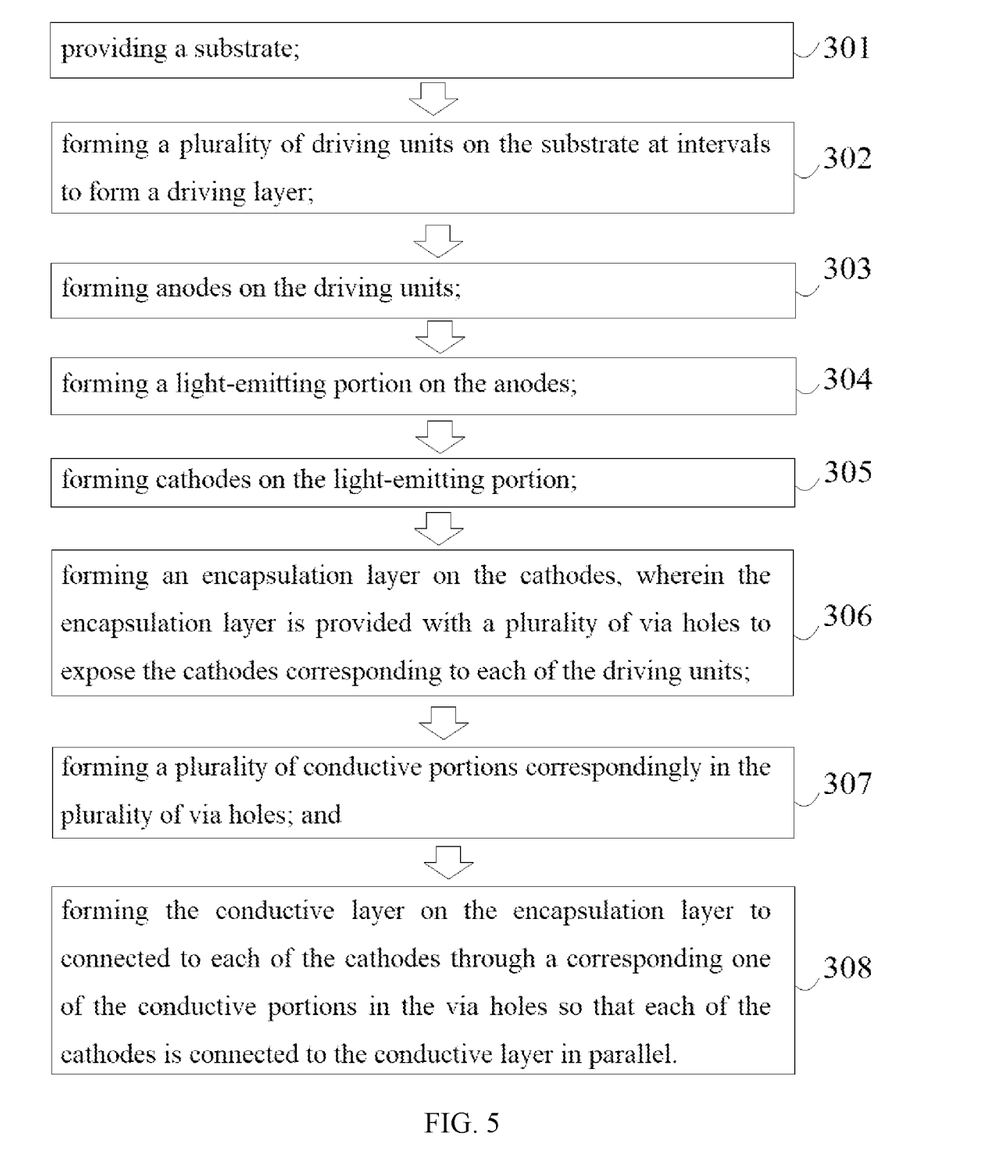
FIG. 5 is a first schematic flowchart of a method of fabricating a display panel provided by an embodiment of the present application.

Exemplarily, referring to FIG. 5 in conjunction with FIG. 1 to FIG. 4, FIG. 5 is a first schematic flowchart of a method of manufacturing a display panel provided by an embodiment of the present application. The structural composition of the display panel 10 can be referred to FIG. 1 to FIG. 4 and the above description, which will not be repeated herein for brevity. The method of manufacturing the display panel includes:

301. providing a substrate.

It should be noted that, in the process of manufacturing the display panel 10, a layer of substrate 112 is usually first provided to provide a foundation for supporting and flatness of the layered structure of the display panel 10. The substrate 112 can generally be a glass substrate. When the display panel 10 is fabricated, the substrate 112 is cut to a predetermined size to form a display screen structure together with other layered structures.

302. forming a plurality of driving units on the substrate at intervals to form a driving layer.

The driving unit 1012 may be fabricated on the substrate 112 first, that is, the TFT structure may be fabricated. The TFT may generally be a layered structure composed of a gate electrode, a source electrode, a drain electrode, an insulating layer, and an interlayer dielectric layer. The plurality of driving units 1012 are disposed on the substrate 112 at intervals, and the plurality of driving units 1012 may be arranged on the substrate 112 in an array. The layered structure composed of a plurality of driving units 1012 arranged at intervals may be referred to as a driving layer 101. The driving unit 1012 is configured to drive the light-emitting unit to emit light, that is, the driving unit 1012 can provide the light-emitting unit with an electrical signal or a scan signal to control the light-emitting unit according to a preset program.

303. forming anodes on the driving units.
304. forming a light-emitting portion on the anodes.
305. forming cathodes on the light-emitting portion.

Regarding the steps 303 to 305:

The anode 102, the light-emitting portion 103, and the cathode 104 form a "sandwich" structure, the light-emitting portion 103 is sandwiched between the anode 102 and the cathode 104, and the light-emitting portion 103 may also be referred to as a pixel unit. The light-emitting portion 103 can be made of organic semiconductor material. The light emission of the light-emitting portion 103 is caused by the injection and recombination of carriers of the anode 102 and the cathode 104, and the luminous intensity is proportional to the injected current. The light-emitting portion 103 may also include a plurality of layered structures, such as a hole injection layer, a hole transport layer, and the like.

It should be noted that, it can be seen from a cross-section of the display panel 10 that widths of the anode 102, the light-emitting portion 103, and the cathode 104 are different, and the width of the light-emitting portion 103 may be smaller than the widths of the anode 102 and the cathode 104. The cathode 104 not only needs to be connected to the light-emitting portion 103 but also needs to be electrically connected to other layered structures. For example, regarding the anode 102, the anode 102 also needs to be connected to the source of the driving unit 1012, so that the electrical signal of the driving unit 1012 can be transmitted to the light-emitting unit.

It should be noted that, since the cathode of the top emission OLED display device is usually thin, the transmission impedance is large, which causes a large voltage drop of the cathode, resulting in uneven display of the display panel 10 or the display device 1. Therefore, in the embodiment of the present application, the equivalent resistance at opposite ends of the cathode 104 is reduced by connecting the conductive layer to the cathode 104 in parallel, thereby reducing the transmission impedance of the cathode 104 and reducing the voltage drop existing in the cathode 104, so that the display panel 10 or the display device 1 displays with improved uniformity.

306. forming an encapsulation layer on the cathodes, wherein the encapsulation layer is provided with a plurality of via holes to expose the cathodes corresponding to each of the driving units.

Since the cathode 104 is made of metal, in order to prevent the cathode 104 from being exposed to the outside and being interfered by external water vapor or oxygen and losing its function, an encapsulation layer 105 can be provided on the side of the cathode 104 away from the light-emitting portion 103, and the encapsulation layer 105 covers the cathode 104.

It should be noted that, since the cathode 104 needs to be connected to the conductive layer to reduce the transmission impedance between the cathode 104 and the conductive layer, a part of the cathode 104 needs to be exposed, and this exposed part of the cathode 104 can be connected to the conductive layer. For example, a plurality of via holes 1052 may be provided in the encapsulation layer 105 to expose the cathode 104 corresponding to each driving unit 1012. It is appreciated that, one of the via holes 1052 may be provided on the encapsulation layer 105 above the cathode 104 corresponding to each driving unit 1012, and a number of the via holes 1052 may be the same as a number of the driving units 1012. In addition, in order to prevent the thickness of the connection between the cathode 104 and the conductive layer from affecting the transmittance of the light-emitting portion 103, the via holes 1052 and the light-emitting portions 103 may be staggered with each other.

307. forming a plurality of conductive portions correspondingly in the plurality of via holes.

The plurality of via holes 1052 are disposed between the cathode 104 and the conductive layer 106. In order to connect the cathode 104 to the conductive layer 106, a conductive portion 100 may be disposed in each of the via holes 1052. The conductive portion 100 is used as a connection carrier between the cathode 104 and the conductive layer 106. During preparation, the conductive portion 100 and the cathode 104 may be integrally formed, or the conductive portion 100 and the conductive layer 106 may be integrally formed to simplify the manufacturing process.

308. forming the conductive layer on the encapsulation layer to connected to each of the cathodes through a corresponding one of the conductive portions in the via holes so that each of the cathodes is connected to the conductive layer in parallel.

The conductive layer 106 is regarded as an auxiliary electrode of the cathode 104, that is, an additional layer of conductive structure is introduced to reduce the transmission impedance of the cathode 104. The conductive layer 106 may be made of a transparent oxide material to prevent the influence of the conductive layer 106 on the light transmittance. Exemplarily, the material of the conductive layer 106 may be ITO, IZO, or a mixed material of ITO and IZO materials, or the like.

The conductive layer 106 is disposed on the side of the encapsulation layer 105 away from the cathode 104, and the conductive layer 106 is attached to the encapsulation layer 105, so that the conductive layer 106 is connected to the cathode 104 corresponding to each driving unit 1012 through the conductive layer 106 in a corresponding one of the via holes 1052. Each cathode 104 is connected in parallel with the conductive layer 106 to reduce the equivalent resistance at opposite ends of the cathodes 104, thereby reducing the voltage drop existing in the cathode 104.

A cover plate 113 may also be provided on the side of the conductive layer 106 away from the cathode 104, and the cover plate 113 may be a glass cover plate. The cover plate 113, the substrate 112, and the light-emitting layer between the cover plate 113 and the substrate 112 constitute the screen structure of the display panel 10 with the driving layer.

It should be noted that the connection between the conductive layer 106 and the cover plate 113 and the encapsulation layer 105 can be performed in the following two methods.

Figure 6:
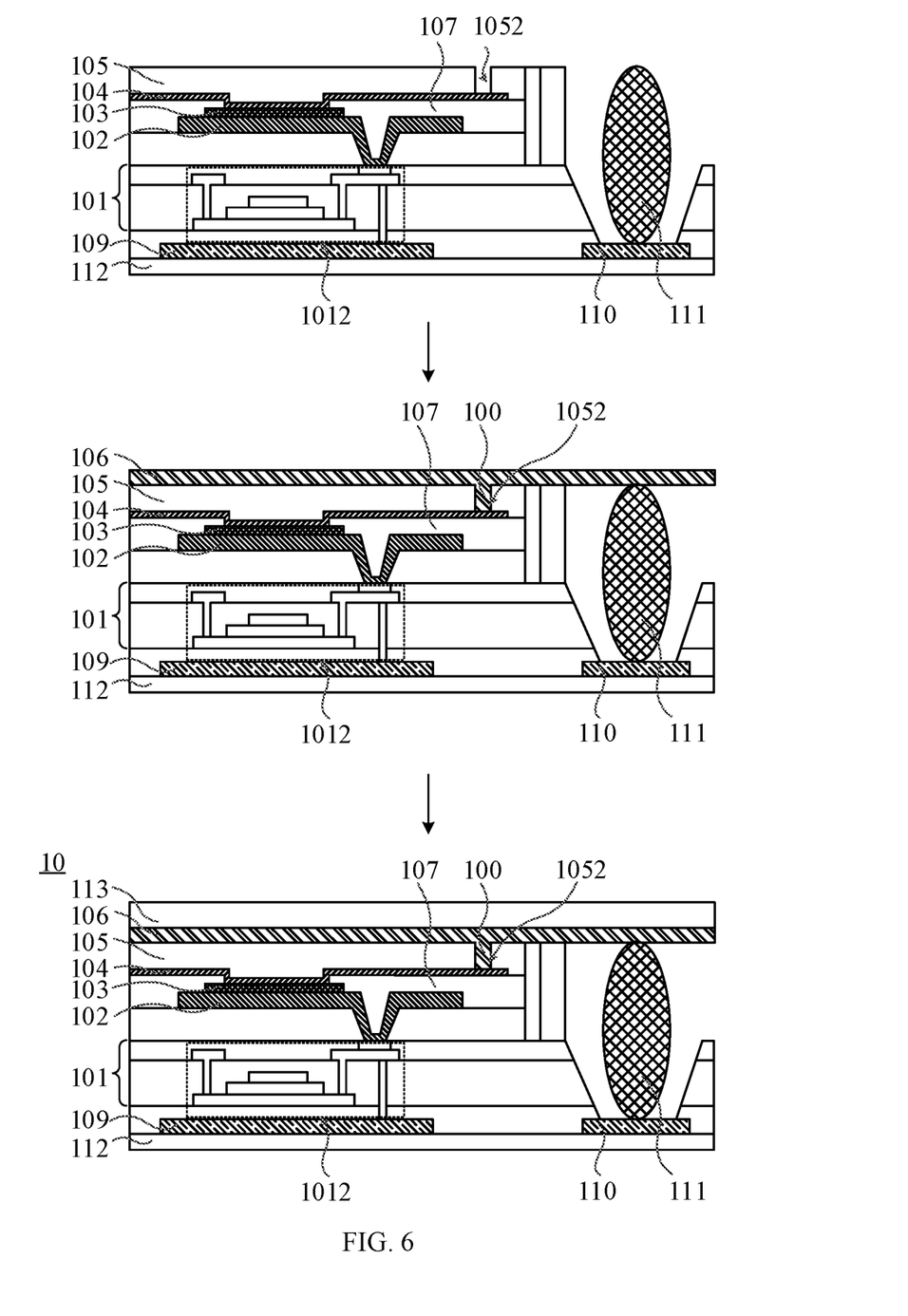
FIG. 6 is a schematic diagram of a first manufacturing process of the method of manufacturing a display panel provided by an embodiment of the present application.

In the first method, referring to FIG. 6 in conjunction with FIG. 1 to FIG. 5, FIG. 6 is a schematic diagram of the first manufacturing process of the method of manufacturing the display panel provided by the embodiment of the present application. The encapsulation layer 105, the conductive layer 106 and the cover plate 113 may be fabricated in a layer-by-layer manner. That is, after step 308, the cover plate 113 is directly disposed on the conductive layer 106. Exemplarily, the conductive layer 106 is disposed on the encapsulation layer 105, the conductive portion 100 can be integrally formed with the conductive layer 106, and the conductive layer 106 can be partially filled in each via hole 1052, so that the conductive layer 106 is connected to each cathode 104 through the conductive portion 100 in the corresponding via hole 1052. After the conductive layer 106 is prepared, the cover plate 113 can be directly covered on the conductive layer 106, that is, the cover plate 113 is disposed on the conductive layer 106.

In this case, the conductive portion 100 and the light-emitting portion 103 in the via hole 1052 are staggered to prevent the thickness of the connection between the conductive layer 106 and the cathode 104 from affecting the light transmittance of the light-emitting portion 103.

Figure 7:
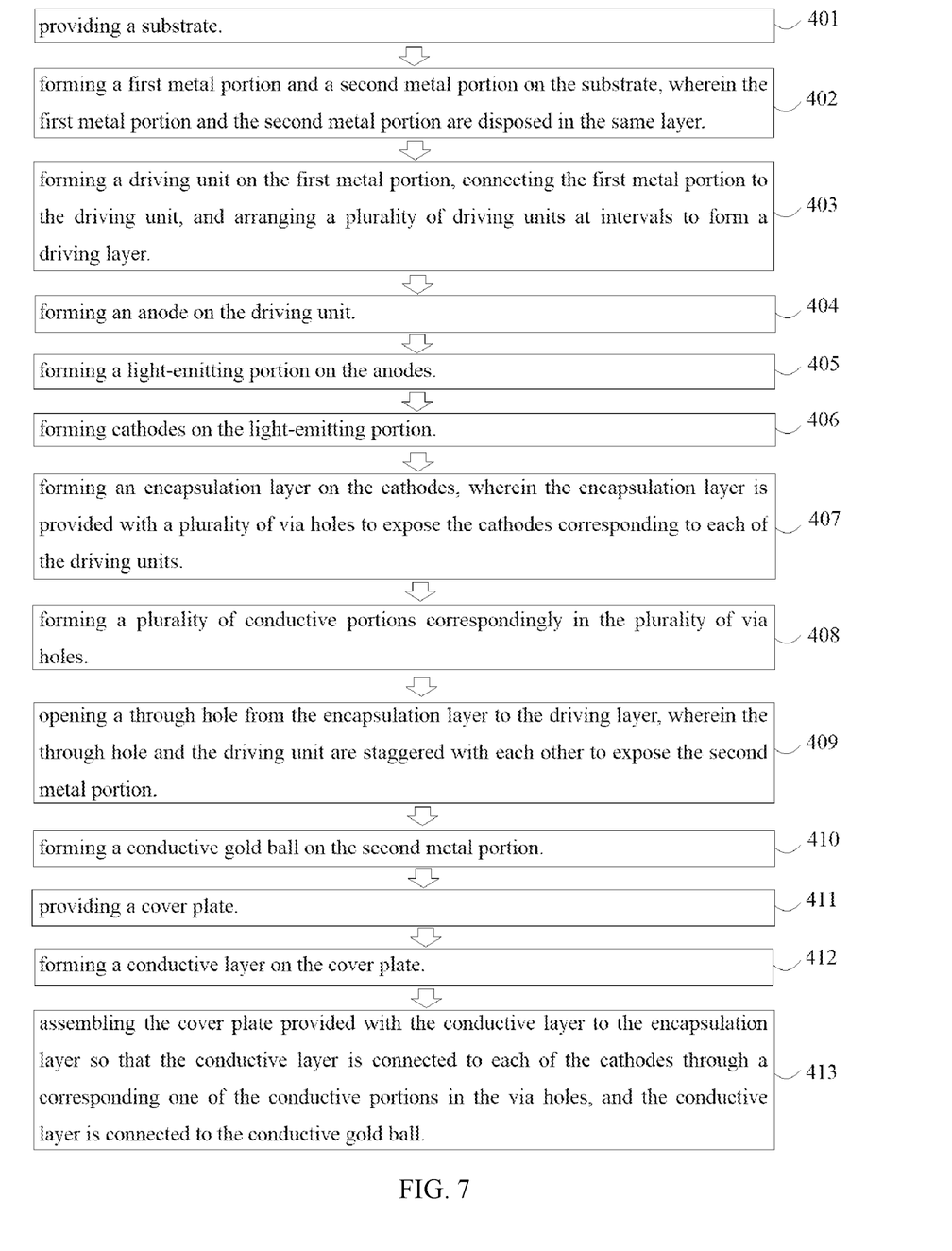
FIG. 7 is a second schematic flowchart of a method of manufacturing a display panel provided by an embodiment of the present application.
Figure 8:
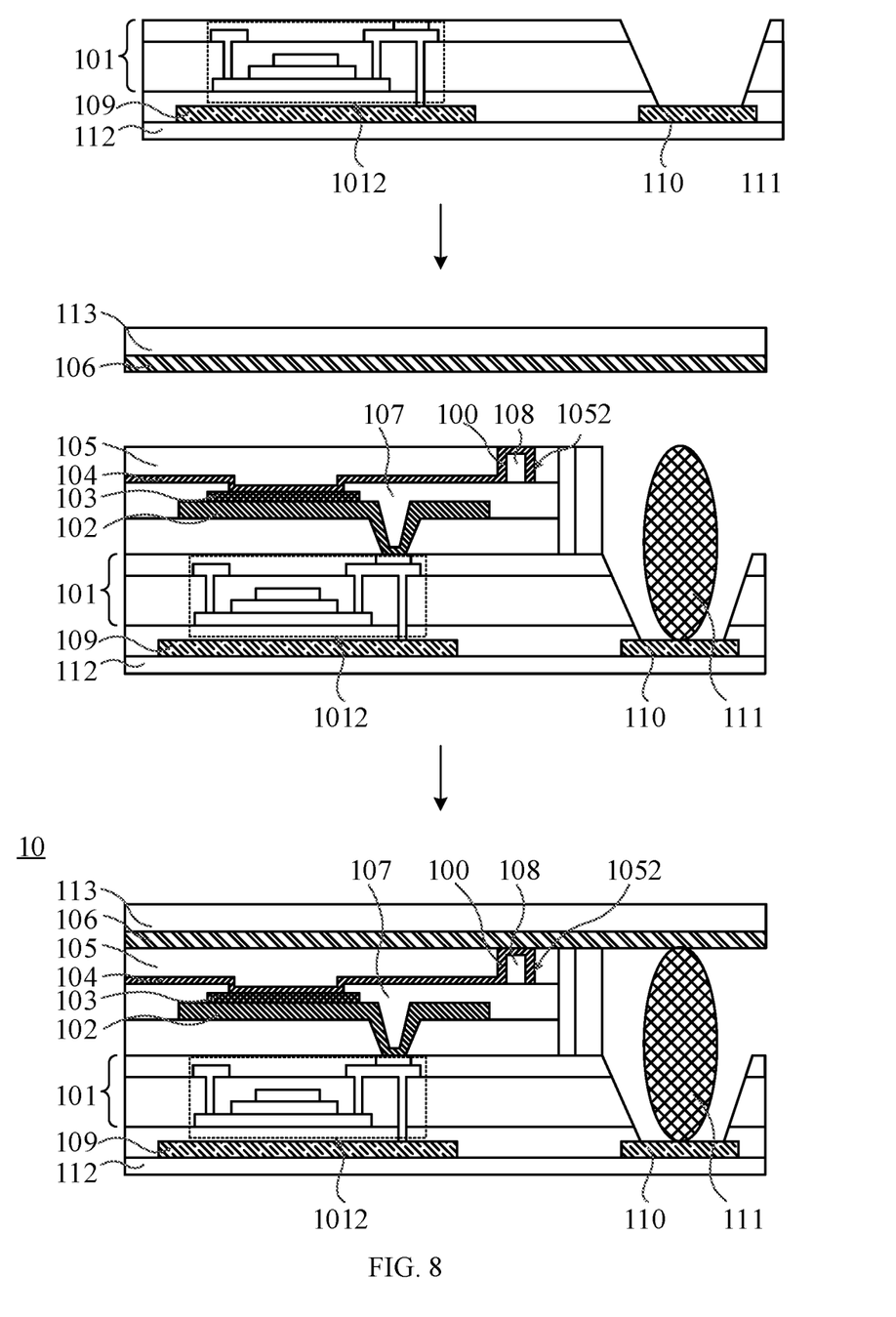
FIG. 8 is a schematic diagram of a second manufacturing process of the method of manufacturing a display panel provided by an embodiment of the present application.

In the second way, referring to FIG. 7 and FIG. 8 in conjunction with FIG. 1 to FIG. 6, FIG. 7 is a second schematic flowchart of the method of manufacturing the display panel provided by the embodiment of the present application, and FIG. 8 is a schematic diagram of the second manufacturing process of the method of manufacturing the display panel. The cathode 104, the encapsulation layer 105, the conductive layer 106, and the cover plate 113 are respectively fabricated, and then the cover plate 113 with the conductive layer 106 is attached to the encapsulation layer 105, and the conductive layer 106 is connected to the cathode 104. Exemplarily, the method of manufacturing the display panel may further include:

401. providing a substrate.

Details may be referred to the description of step 301, which will not be repeated herein for brevity.

402. forming a first metal portion and a second metal portion on the substrate, wherein the first metal portion and the second metal portion are disposed in the same layer.

Each of the first metal portion 109 and the second metal portion 110 is a metal layer which is first fabricated in the manufacturing of the display panel 10, and then the driving unit 1012 and the light-emitting unit are fabricated sequentially on the first metal portion 109.

403. forming a driving unit on the first metal portion, connecting the first metal portion to the driving unit, and arranging a plurality of driving units at intervals to form a driving layer.

The first metal portion 109 is disposed on the side of the driving unit 1012 away from the light-emitting portion 103, and the first metal portion 109 can be connected to the driving unit 1012 to transmit scan signals or electrical signals to the driving unit 1012. The plurality of driving units 1012 form the driving layer 101.

404. forming an anode on the driving unit.

405. forming a light-emitting portion on the anodes.

406. forming cathodes on the light-emitting portion.

407. forming an encapsulation layer on the cathodes, wherein the encapsulation layer is provided with a plurality of via holes to expose the cathodes corresponding to each of the driving units.

408. forming a plurality of conductive portions correspondingly in the plurality of via holes.

The steps 404 to 408 may be referred to the description of steps 303 to 307, which will not be repeated herein for brevity.

409, opening a through hole from the encapsulation layer to the driving layer, wherein the through hole and the driving unit are staggered with each other to expose the second metal portion.

410. forming a conductive gold ball on the second metal portion.

Regarding the steps 409 and 410:

In order to increase the conductivity of the cathode 104 and the conductive layer, the conductive gold ball 111 may be added. For example, the through hole may be opened from the encapsulation layer 105 to a region of the driving layer 101 without the driving units 1012 to expose the second metal portion 110. The second metal portion 110 and the first metal portion 109 are disposed in the same layer and spaced apart from each, that is, the second metal portion 110 does not correspond to the driving unit 1012, and the second metal portion 110 and the driving unit 1012 are staggered with each other. Then, conductive gold ball 111 is disposed on the second metal portion 110. One end of the conductive gold ball 111 away from the substrate 112 may be flush with the upper surface of the encapsulation layer 105 away from the driving unit 1012.

411. providing a cover plate.
412. forming a conductive layer on the cover plate.
413. assembling the cover plate provided with the conductive layer to the encapsulation layer so that the conductive layer is connected to each of the cathodes through a corresponding one of the conductive portions in the via holes, and the conductive layer is connected to the conductive gold ball.

Regarding the steps 410 to 412:

It should be noted that, after the cathode 104 and the encapsulation layer 105 are fabricated, the conductive layer 106 can be provided on the cover plate 113, and then the cover plate 113 with the conductive layer 106 is flipped over and assembled to the encapsulation layer 105. The assembly is interpreted as: the conductive layer 106 and the encapsulation layer 105 are positioned and then attached to each other for connection, so that the conductive layer 106 is connected to the exposed cathode 104 corresponding to each driving unit 1012. In this case, the conductive portion 100 can be integrally formed with the cathode 104, thereby simplifying the manufacturing process of the display panel 10.

The conductive gold ball 111 crosses over the driving unit and the light-emitting unit, and connects the second metal portion 110 to the conductive layer 106, so that the current can be introduced from the second metal portion 110 and flow to the cathode 104 through the conductive gold ball 111 and the conductive layer 106 in sequence. Exemplarily, the conductive gold ball 111 may only be disposed at an edge of the display panel 10.

In this case, the cathode 104 can be raised so that the cathode 104 can be connected with the conductive layer 106. After arranging the light-emitting portion 103 on the anode 102, the method of manufacturing the display panel may further include:

A blocking layer is provided on the anode, and the blocking layer is adjacent to the light-emitting portion.

The blocking layer 107 is disposed between the anode 102 and the cathode 104 and is adjacent to the light-emitting portion 103. The blocking layer 107 can also be referred to as a black matrix or a light-shielding layer. The blocking layer 107 is configured to separate the anode 102 from the cathode 104 and can separate the light-emitting portions 103 between different light-emitting units to prevent the space between the light-emitting portions 103 interference.

A plurality of protrusions are provided on the blocking layer.

Each protrusion 108 is disposed between the cathode 104 and the blocking layer 107, and the plurality of protrusions 108 are respectively disposed in the plurality of via holes 1052. It should be noted that the conductive portion 100 and the cathode 104 are integrally formed, that is, a part of the cathode 104 is arranged in the via hole 1052, and the arrangement of the protrusion 108 can elevate the portion of the cathode 104 corresponding to the via hole 1052 so as to facilitate the connection of the cathode 104 to conductive layer 106. Exemplarily, the upper surface of the cathode 104 connected to the conductive layer 106 is flush with the upper surface of the encapsulation layer 105 facing the conductive layer 106. The cathode 104 arranged in this way can be easily connected to the conductive layer 106. During production, the cathode 104 and the conductive layer 106 can be separately fabricated at the same time, and then the fabricated conductive layer 106 is buckled to the encapsulation layer 105, so that the conductive layer 106 and the cathode 104 are connected.

A cathode is provided on the blocking layer, the light-emitting portion and the protrusion. An encapsulation layer is arranged on the cathode, and a plurality of via holes are respectively opened at the positions of the encapsulation layer corresponding to the plurality of protrusions.

The cathode 104 covers a portion of the blocking layer 107, covers the light-emitting portion 103, and covers the protrusion 108. Since the thickness of the cathode 104 is the same in different regions, the part of the cathode 104 corresponding to the light-emitting portion 103 can follow the light-emitting portion 103 to be partially recessed. This is because the upper surface of the light-emitting portion 103 connected to the cathode 104 and the upper surface of the blocking layer 107 connected to the cathode 104 are not flush. The portion of the cathode 104 corresponding to the protrusion 108 is raised by the protrusion 108 and is located in the via hole 1052. The cathode 104 can be connected to the conductive layer 106 when the upper surface of the cathode 104 corresponding to the protrusion 108 connected to the conductive layer 106 is flush with the upper surface of the encapsulation layer 105 connected to the conductive layer 106.

It should be noted that the positions of the via holes 1052 are set according to the protrusions 108. Therefore, during fabrication, the protrusions 108 are usually fabricated first, then the cathode 104 is fabricated, and then the encapsulation layer 105 is fabricated. The positions of the via holes 1052 can then be opened according to the raised cathodes 104.

It should be noted that, whether the conductive layer 106 is directly stacked on the encapsulation layer 105 as in the first method, or the cover plate 113 with the conductive layer 106 is connected to the encapsulation layer 105 by assembly as in the second method. Other conductive structures may be provided to further increase the conductivity of the cathode 104. That is to say, for the arrangement of the conductive gold balls 111, the first method can refer to the description of the second method. To put it another way, the method of manufacturing the display panel may further include:

A first metal portion and a second metal portion are arranged on the substrate, and the first metal portion and the second metal portion are arranged in the same layer. Each of the first metal portion 109 and the second metal portion 110 is a metal layer which is first fabricated in the manufacturing of the display panel 10, and then the driving unit 1012 and the light-emitting unit are fabricated sequentially on the first metal portion 109.

A driving unit is provided on the first metal portion, and the first metal portion is connected to the driving unit. The first metal portion 109 is disposed on the side of the driving unit 1012 away from the light-emitting portion 103, and the first metal portion 109 can be connected to the driving unit 1012 to transmit scan signals or electrical signals to the driving unit 1012.

A conductive gold ball is arranged on the second metal portion, and the conductive gold ball is connected to the conductive layer. The second metal portion 110 and the first metal portion 109 are disposed in the same layer and spaced apart from each other, that is, the second metal portion 110 does not correspond to the driving unit 1012, and the second metal portion 110 and the driving unit 1012 are staggered with each other. The conductive gold ball 111 connects the second metal portion 110 to the conductive layer 106. For example, in the power-on state, the current can flow to the conductive layer 106 through the peripheral conductive gold balls 111, and then be transmitted to the cathode 104. The conductive gold ball 111 crosses over the driving unit and the light-emitting unit, and connects the second metal portion 110 to the conductive layer 106, so that the current can be introduced from the second metal portion 110 and flow to the cathode 104 through the conductive gold ball 111 and the conductive layer 106 in sequence. Exemplarily, the conductive gold ball 111 may only be disposed at an edge of the display panel 10.

In the display panel 10 and the manufacturing method thereof and the display device 1 provided by the embodiments of the present application, by disposing the conductive layer 106 on the side of the encapsulation layer 105 away from the cathode 104, and the conductive layer 106 is connected in parallel with the cathode 104 corresponding to each driving unit 1012, an equivalent resistance at opposite ends of the cathode 104 can be reduced. In the solution of only setting a thinner cathode, the cathode 104 and the conductive layer 106 of the present application can transmit less impedance, thereby reducing the voltage drop at opposite ends of the cathode 104 and improving a display uniformity of the display device 1.

In the above-mentioned embodiments, the description of each embodiment has its own emphasis. The parts that are not described in detail in an embodiment can be referred to the detailed descriptions in other embodiments.

In the description of this application, the terms "first" and "second" are only used for descriptive purposes, and cannot be understood as indicating or implying relative importance or implicitly indicating the number of technical features indicated. Therefore, the features defined as "first" and "second" may explicitly or implicitly include one or more of the features.

The display panel, the manufacturing method thereof, and the display device provided in the embodiments of the present application have been described in detail above. Specific examples are configured to explain the principle and implementation of the present application. The descriptions of the above embodiments are only configured to help understand the present application. Also, for those skilled in the art, according to the ideas of the present application, there will be changes in the specific implementation and application scope. In summary, the content of this specification should not be construed as limiting the present application.

What is claimed is:

1. A display panel, comprising:
    a driving layer comprising a plurality of driving units arranged at intervals;
    a plurality of anodes disposed on a side of the driving units;
    a light-emitting portion disposed on a side of the anodes away from the driving units;
    a plurality of cathodes disposed on a side of the light-emitting portion away from the driving units;
    an encapsulation layer disposed on a side of the cathodes away from the driving units, wherein the encapsulation layer is provided with a plurality of via holes to expose the cathodes corresponding to each of the driving units;
    a plurality of conductive portions correspondingly disposed in the plurality of via holes; and
    a conductive layer disposed on a side of the encapsulation layer away from the driving units, wherein the conductive layer is connected to each of the cathodes through a corresponding one of the conductive portions in the via holes, so that each of the cathodes is connected to the conductive layer in parallel;
    wherein the display panel further comprises:
    a plurality of first metal portions disposed on a side of the driving units away from the light-emitting portion, wherein one of the first metal portions is connected to corresponding one of the driving units;
    a second metal portion disposed in a same layer as the first metal portion and spaced apart from the first metal portions;
    a conductive gold ball directly connected to the conductive layer and the second metal portion.

2. The display panel according to claim 1, wherein the display panel further comprises:
    a barrier layer disposed between the anodes and the cathodes, and connected to the light-emitting portion; and
    a plurality of protrusions, wherein each of protrusions is disposed between the cathodes and the barrier layer, and the plurality of protrusions are respectively disposed in the plurality of via holes.

3. The display panel according to claim 2, wherein the conductive portions and the cathodes are integrally formed, and an upper surface of the cathodes connected to the conductive layer is flush with an upper surface of the encapsulation layer facing the conductive layer.

4. The display panel according to claim 1, wherein the conductive portions are integrally formed with the conductive layer, and a part of the conductive layer is disposed in the via holes and connected to the cathodes.

5. The display panel according to claim 1, wherein an orthographic projection of each of the conductive portions in the via holes on the conductive layer is spaced apart from an orthographic projection of a corresponding one of light-emitting portion on the conductive layer.

6. The display panel according to claim 5, wherein a light transmittance of the conductive layer is greater than a light transmittance of the cathodes.

7. The display panel according to claim 6, wherein the conductive layer is made of indium tin oxide or indium zinc oxide.

8. The display panel according to claim 1, wherein the conductive gold ball is disposed at an edge of the display panel.

9. The display panel according to claim 1, wherein a gettering agent and a barrier portion are disposed between the conductive gold ball and the light-emitting portion to space the conductive gold ball from the light-emitting portion.

10. A method of manufacturing a display panel, comprising:
- providing a substrate;
- forming a plurality of driving units on the substrate at intervals to form a driving layer;
- forming a plurality of anodes on the driving units;
- forming a light-emitting portion on the anodes;
- forming a plurality of cathodes on the light-emitting portion;
- forming an encapsulation layer on the cathodes, wherein the encapsulation layer is provided with a plurality of via holes to expose the cathodes corresponding to each of the driving units;
- forming a plurality of conductive portions correspondingly in the plurality of via holes;
- defining a through hole from the encapsulation layer to the driving layer, wherein the through hole and the driving unit are staggered with each other and exposes the second metal portion;
- forming a conductive gold ball on the second metal portion, wherein the conductive gold ball is directly connected to the second metal portion through the through hole; and
- forming the conductive layer on the encapsulation layer to connect to each of the cathodes through a corresponding one of the conductive portions in the via holes so that each of the cathodes is connected to the conductive layer in parallel, wherein the conductive layer is directly connected to the conductive gold ball.

11. The method of manufacturing the display panel according to claim 10, wherein the step of forming the conductive layer on the encapsulation layer to connect to each of the cathodes through a corresponding one of the conductive portions in the via holes so that each of the cathodes is connected to the conductive layer in parallel comprises:
- providing a cover plate;
- forming a conductive layer on the cover plate; and
- assembling the cover plate provided with the conductive layer to the encapsulation layer so that the conductive layer is connected to each of the cathodes through a corresponding one of the conductive portions in the via holes.

12. The method of manufacturing the display panel according to claim 11, wherein after the step of forming the light-emitting portion on the anodes, the method of manufacturing the display panel further comprises:
- forming a barrier layer on the anodes, wherein the barrier layer is adjacent to the light-emitting portion; forming a plurality of protrusions on the barrier layer;
- forming cathodes on the barrier layer, the light-emitting portion, and the protrusions, wherein the conductive portions are integrally formed with the cathodes; and
- forming an encapsulation layer on the cathodes, and opening a plurality of via holes in the encapsulation layer corresponding to the protrusions to expose the cathodes.

13. The method of manufacturing the display panel according to claim 10, wherein in the step of forming the conductive layer on the encapsulation layer to connect to each of the cathodes through a corresponding one of the conductive portions in the via holes so that each of the cathodes is connected to the conductive layer in parallel, the method of manufacturing the display panel further comprises:
- integrally forming the conductive portions with the conductive layer, and forming a part of the conductive layer in the via holes to connect to the cathodes; and
- forming a cover plate on a side of the conductive layer away from the encapsulation layer.

14. A display device, comprising:
- a display panel, comprising:
  - a driving layer comprising a plurality of driving units arranged at intervals;
  - anodes disposed on a side of the driving units;
  - a light-emitting portion disposed on a side of the anodes away from the driving units;
  - cathodes disposed on a side of the light-emitting portion away from the driving units;
  - an encapsulation layer disposed on a side of the cathodes away from the driving units, wherein the encapsulation layer is provided with a plurality of via holes to expose the cathodes corresponding to each of the driving units;
  - a plurality of conductive portions corresponding to the plurality of via holes;
  - a conductive layer is disposed on a side of the encapsulation layer away from the driving units, wherein the conductive layer is connected to each of the cathodes through a corresponding one of the conductive portions in the via holes, so that each of the cathodes is connected to the conductive layer in parallel; and
- a casing configured to carry the display panel;
- wherein the display panel further comprises:
  - a plurality of first metal portions disposed on a side of the driving units away from the light-emitting portion, wherein one of the first metal portions is connected to corresponding one of the driving units;
  - a second metal portion disposed in a same layer as the first metal portion and spaced apart from the first metal portions;
  - a conductive gold ball directly connected to the conductive layer and the second metal portion.

15. The display device according to claim 14, wherein the display panel further comprises:
- a barrier layer disposed between the anodes and the cathodes, and connected to the light-emitting portion; and
- a plurality of protrusions, wherein each of protrusions is disposed between the cathodes and the barrier layer, and the plurality of protrusions are respectively disposed in the plurality of via holes.

16. The display device according to claim 15, wherein the conductive portions and the cathodes are integrally formed, and an upper surface of the cathodes connected to the conductive layer is flush with an upper surface of the encapsulation layer facing the conductive layer.

17. The display device according to claim 14, wherein the conductive portions are integrally formed with the conductive layer, and a part of the conductive layer is disposed in the via holes and connected to the cathodes.

18. The display device according to claim 14, wherein an orthographic projection of each of the conductive portions in the via holes on the conductive layer is spaced apart from an orthographic projection of a corresponding one of light-emitting portion on the conductive layer.

* * * * *